(12) United States Patent
Hisada et al.

(10) Patent No.: US 6,841,436 B2
(45) Date of Patent: Jan. 11, 2005

(54) METHOD OF FABRICATING SIC SEMICONDUCTOR DEVICE

(75) Inventors: Yoshiyuki Hisada, Okazaki (JP); Eiichi Okuno, Gifu-ken (JP); Takeshi Hasegawa, Aichi-ken (JP)

(73) Assignee: Denso Corporation, Kariya (JP)

( * ) Notice: Subject to any disclaimer, the term of this patent is extended or adjusted under 35 U.S.C. 154(b) by 132 days.

(21) Appl. No.: 10/267,867

(22) Filed: Oct. 10, 2002

(65) Prior Publication Data

US 2003/0073270 A1 Apr. 17, 2003

(30) Foreign Application Priority Data

Oct. 15, 2001 (JP) .......................... 2001-317022

(51) Int. Cl.[7] .................... H01L 21/336; H01L 21/31
(52) U.S. Cl. .................... 438/197; 438/268; 438/285; 438/767; 438/105; 438/779
(58) Field of Search ................. 438/197, 285, 438/268, 105, 767, 779

(56) References Cited

U.S. PATENT DOCUMENTS

| | | | |
|---|---|---|---|
| 6,589,337 B2 | * | 7/2003 | Hisada et al. .................. 117/95 |
| 6,667,102 B1 | * | 12/2003 | Amy et al. .................. 428/446 |
| 6,764,963 B2 | * | 7/2004 | Fukuda et al. .............. 438/778 |

FOREIGN PATENT DOCUMENTS

| | | |
|---|---|---|
| JP | 2000-133657 | 5/2000 |
| JP | 2000-252461 | 9/2000 |
| JP | 2001-345320 | 12/2001 |
| JP | 2002-222950 | 8/2002 |

* cited by examiner

*Primary Examiner*—Michael Trinh
(74) *Attorney, Agent, or Firm*—Posz & Bethards, PLC

(57) ABSTRACT

In a method of fabricating a SiC semiconductor device, a surface of a SiC layer (5, 48, 102) is processed into a cleaned surface terminated at Si. An oxide film (7, 49, 105) is formed on the cleaned surface of the SiC layer. The SiC layer with the oxide film is subjected to thermal oxidation at a temperature in a range of 700° C. to 900° C. so that only terminal Si at the cleaned surface of the SiC layer is oxidated and an interface between the oxide film and the SiC layer becomes an $SiO_2$/SiC cleaned interface.

16 Claims, 13 Drawing Sheets

METHOD OF FABRICATING SIC SEMICONDUCTOR DEVICE

BACKGROUND OF THE INVENTION

1. Field of the Invention

This invention generally relates to a method of fabricating a semiconductor device having basic portions made of silicon carbide (SiC). This invention specifically relates to a method of fabricating, for example, a SiC MOSFET.

2. Description of the Related Art

There is a known semiconductor device including a SiC substrate or a 4H—SiC substrate. In the case where an oxide film (an $SiO_2$ film) formed on a SiC substrate, especially a 4H—SiC substrate, is used as a gate oxide film, an interface level density is extremely high so that a channel mobility decreases. It is thought that the high interface level density is caused by impurity such as carbon which remains in an $SiO_2$/SiC interface between the gate oxide film and the SiC substrate. When the SiC substrate is thermally oxidized to form the gate oxide film, the oxidization causes carbon to remain in the $SiO_2$/SiC interface as impurity. On the other hand, in the case where the gate oxide film is formed on the SiC substrate by deposition, the SiC substrate is exposed to the atmosphere after being treated with HF. In this case, carbon in the atmosphere adheres to a surface of the SiC substrate, and then an $SiO_2$ film is deposited on the surface of the SiC substrate as the gate oxide film. Therefore, carbon remains in the $SiO_2$/SiC interface as impurity. It is thought that such impurity causes the high interface level density.

Japanese patent application number 2001-17263 which is not prior art to this invention relates to a method of fabricating a SiC semiconductor device. The method in Japanese application 2001-17263 includes a step of executing thermal oxidation at a high temperature to reduce the amount of carbon remaining in an $SiO_2$/SiC interface between a gate oxide film and a SiC substrate. The reduction in the amount of remaining carbon results in a decrease in an interface level density. According to the method in Japanese application 2001-17263, it is difficult to nullify the amount of remaining carbon.

Japanese patent application publication number P2000-133657A discloses a method of fabricating a SiC semiconductor device. According to the method in Japanese application P2000-133657A, a SiC substrate is thermally oxidized to form an oxide film, and an oxide/SiC interface occurs. The method is designed to decrease an interface level density at the oxide/SiC interface. Specifically, the method includes a first step of forming a silicon oxide film on one main surface of the SiC substrate, and a second step of treating the SiC substrate and the silicon oxide film with a hydrogen plasma atmosphere to reduce the interface level density at the oxide/SiC interface.

Japanese patent application publication number P2000-252461A discloses a method of fabricating a semiconductor device. According to the method in Japanese application P2000-252461A, a semiconductor substrate having an uppermost layer containing SiC is used, and a gate insulating film is formed on the semiconductor substrate. There is a gate-insulating-film/SiC interface. The gate insulating film includes at least one layer of an oxide or a nitride. The semiconductor substrate with the gate insulating film is annealed in an atmosphere at a temperature of 600° C. to 1600° C. The atmosphere contains hydrogen. As a result of the annealing in the hydrogen-based atmosphere, dangling bonds of carbon or silicon at the gate-insulating-film/SiC interface are terminated at hydrogen so that an interface level density is sufficiently reduced.

Japanese patent application publication number P2001-345320A which is not prior art to this invention relates to a method of fabricating a semiconductor device. According to the method in Japanese application P2001-345320A, a silicon oxide film (an $SiO_2$ film) is formed on a semiconductor substrate of SiC by a chemical vapor growth method. There is an interface between $SiO_2$/SiC. The method is designed to improve the quality of the silicon oxide film to provide a low interface level density at the $SiO_2$/SiC interface. Specifically, to improve the quality of the silicon oxide film, the semiconductor substrate with the silicon oxide film is heat-treated in an inert gas at a temperature of 1100° C. to 1400° C. for 30 minutes or longer.

SUMMARY OF THE INVENTION

It is an object of this invention to sufficiently reduce the amount of carbon remaining in an $SiO_2$/SiC interface to provide a low interface level density and a good channel mobility.

A first aspect of this invention provides a method of fabricating a SiC semiconductor device. The method comprises the steps of processing a surface of a SiC layer (5, 48, 102) into a cleaned surface terminated at Si; forming an oxide film (7, 49, 105) on the cleaned surface of the SiC layer; and subjecting the SiC layer with the oxide film to thermal oxidation at a temperature in a range of 700° C. to 900° C., thereby oxidating only terminal Si at the cleaned surface of the SiC layer and causing an interface between the oxide film and the SiC layer to be an $SiO_2$/SiC cleaned interface.

A second aspect of this invention is based on the first aspect thereof, and provides a method wherein the temperature of the thermal oxidation is equal to 875° C.

A third aspect of this invention is based on the first aspect thereof, and provides a method further comprising the step of placing the SiC layer with the oxide film in a dry $O_2$ atmosphere during the thermal oxidation.

A fourth aspect of this invention provides a method of fabricating a SiC semiconductor device. The method comprises the steps of processing a surface of a SiC layer (5, 48, 102) into a cleaned surface terminated at Si; forming an oxide film (7, 49, 105) on the cleaned surface of the SiC layer; and subjecting the SiC layer with the oxide film to heat treatment at a temperature in a range of 800° C. to 1000° C., thereby enabling terminal Si at the cleaned surface of the SiC layer and $SiO_2$ in the oxide film to be electrically active and causing an interface between the oxide film and the SiC layer to be an $SiO_2$/SiC cleaned interface.

A fifth aspect of this invention is based on the fourth aspect thereof, and provides a method wherein the temperature of the heat treatment is equal to 1000° C.

A sixth aspect of this invention is based on the fourth aspect thereof, and provides a method further comprising the step of placing the SiC layer with the oxide film in an inert gas atmosphere during the heat treatment.

A seventh aspect of this invention provides a method of fabricating a SiC semiconductor device. The method comprises the steps of processing a surface of a SiC layer (5, 48, 102) into a cleaned surface terminated at Si; forming a Si layer (31) on the cleaned surface of the SiC layer; and subjecting the SiC layer with the Si layer to thermal oxidation at a temperature in a range of 700° C. to 900° C., thereby oxidating only Si in the Si layer and terminal Si at the cleaned surface of the SiC layer to form an oxide film (7, 49, 105) on the resultant SiC layer, and causing an interface between the oxide film and the resultant SiC layer to be an $SiO_2$/SiC cleaned interface.

An eighth aspect of this invention is based on the seventh aspect thereof, and provides a method further comprising the step of depositing an $SiO_2$ layer (32) on the Si layer before the thermal oxidation is executed, wherein the $SiO_2$ layer forms a portion of the oxide film.

A ninth aspect of this invention provides a method of fabricating a SiC semiconductor device. The method comprises the steps of processing a surface of a SiC layer (5, 48, 102) into a cleaned surface terminated at Si; and thermally oxidating a surface portion of the SiC layer, which includes the cleaned surface thereof, at a temperature in a range of 1000° C. to 1400° C. to form an oxide film (7, 49, 105) on the resultant SiC layer.

A tenth aspect of this invention is based on the seventh aspect thereof, and provides a method wherein the thermal oxidation includes an oxidation process using one of $O_2$, $H_2O$, $O_3$, and oxygen radical.

An eleventh aspect of this invention is based on the first aspect thereof, and provides a method wherein the oxide-film forming step comprises executing LPCVD at a deposition rate of 5 nm/min or less.

A twelfth aspect of this invention is based on the first aspect thereof, and provides a method wherein the surface processing step comprises cleaning the surface of the SiC layer; forming a Si layer (30) on the cleaned surface of the SiC layer; and evaporating most Si of the Si layer and leaving a small number of Si of the Si layer to make the cleaned surface terminated at Si.

A thirteenth aspect of this invention is based on the first aspect thereof, and provides a method wherein the Si-terminated cleaned surface of the SiC layer has one of a 3×3 structure, a $2 \cdot 3^{1/2} \times 2 \cdot 13^{1/2}$ structure, a $3^{1/2} \times 3^{1/2}$ structure, and a 6×6 structure.

A fourteenth aspect of this invention is based on the first aspect thereof, and provides a method further comprising the step of forming a protective film of SiOx on the cleaned surface of the SiC layer, wherein the oxide film is formed on the protective film.

A fifteenth aspect of this invention is based on the first aspect thereof, and provides a method further comprising the step of exposing the Si-terminated cleaned surface of the SiC layer to one of H and $H_2$, thereby changing the Si-terminated cleaned surface of the SiC layer into an H-terminated cleaned surface, wherein the oxide film is formed on the H-terminated cleaned surface of the SiC layer.

A sixteenth aspect of this invention provides a method of fabricating a SiC semiconductor device. The method comprises the steps of processing a surface of a SiC layer (5, 48, 102) into a cleaned surface terminated at C; forming a silicon oxide film (7, 49, 105) on the cleaned surface of the SiC layer; and subjecting the SiC layer with the oxide film to heat treatment at a temperature in a range of 1200° C. to 1400° C., thereby enabling terminal C at the cleaned surface of the SiC layer and Si in the oxide film to form SiC and causing an interface between the oxide film and the SiC layer to be an $SiO_2$/SiC cleaned interface.

A seventeenth aspect of this invention is based on the sixteenth aspect thereof, and provides a method wherein the temperature of the heat treatment is equal to 1250° C.

An eighteenth aspect of this invention is based on the sixteenth aspect thereof, and provides a method further comprising the step of placing the SiC layer with the oxide film in an inert gas atmosphere during the heat treatment.

A nineteenth aspect of this invention is based on the sixteenth aspect thereof, and provides a method wherein the oxide-film forming step comprises executing LPCVD at a deposition rate of 5 nm/min or less.

A twentieth aspect of this invention provides a method of fabricating a SiC semiconductor device. The method comprises the steps of making a surface of a SiC layer (5, 48, 102) terminated at a C layer; removing the terminal C layer from the SiC layer to form a clean surface of the SiC layer; and forming an oxide film (7, 49, 105) on the clean surface of the SiC layer.

A twenty-first aspect of this invention is based on the twentieth aspect thereof, and provides a method wherein the removing step comprises hydrogen-based etching which uses a hydrogen atmosphere.

A twenty-second aspect of this invention is based on the twentieth aspect thereof, and provides a method wherein the oxide-film forming step comprises thermally oxidating a surface portion of the SiC layer.

A twenty-third aspect of this invention is based on the twentieth aspect thereof, and provides a method wherein the oxide-film forming step comprises depositing the oxide film on the SiC layer.

A twenty-fourth aspect of this invention provides a method of fabricating a SiC semiconductor device. The method comprises the steps of making a surface of a SiC layer (5, 48, 102) terminated at C; forming an oxide film (7, 49, 105) on the C-terminated surface of the SiC layer; and after the formation of the oxide film, removing dangling bonds from the surface of the SiC layer and thereby causing an interface between the oxide film and the SiC layer to be an $SiO_2$/SiC cleaned interface.

A twenty-fifth aspect of this invention is based on the twenty-fourth aspect thereof, and provides a method wherein the dangling-bond removing step comprises terminating the dangling bonds at H.

A twenty-sixth aspect of this invention is based on the sixteenth aspect thereof, and provides a method further comprising the step of exposing the C-terminated cleaned surface of the SiC layer to one of H and $H_2$ before, during, or after the formation of the oxide film, thereby changing the C-terminated cleaned surface of the SiC layer into an H-terminated cleaned surface.

A twenty-seventh aspect of this invention is based on the sixteenth aspect thereof, and provides a method further comprising the step of forming a protective film of SiOx on the C-terminated cleaned surface of the SiC layer, wherein the oxide film is formed on the protective film.

A twenty-eighth aspect of this invention is based on the sixteenth aspect thereof, and provides a method wherein the surface processing step comprises cleaning the surface of the SiC layer; forming a Si layer (30) on the cleaned surface of the SiC layer; and evaporating the Si layer to make the cleaned surface terminated at C.

A twenty-ninth aspect of this invention is based on the sixteenth aspect thereof, and provides a method wherein the C-terminated cleaned surface of the SiC layer has one of a 1×1 structure, a $3^{1/2} \times 3^{1/2}$ structure, and a 6×6 structure.

A thirtieth aspect of this invention provides a method of fabricating a SiC semiconductor device. The method comprises the steps of processing a surface of a SiC layer (5, 48, 102) into a cleaned surface terminated at Si; causing terminal Si at the cleaned surface of the SiC layer and also Si and C in a portion of the SiC layer to react with an oxygen-containing gas and generate reaction-resultant substances; removing the reaction-resultant substances to provide the SiC layer with a cleaned surface having a 1×1 structure where only Si atoms and C atoms composing SiC are periodically arranged; and forming an oxide film (7, 49, 105) on the cleaned 1×1-structure surface of the SiC layer.

A thirty-first aspect of this invention is based on the thirtieth aspect thereof, and provides a method wherein the oxide-film forming step comprises thermally oxidating a surface portion of the SiC layer.

A thirty-second aspect of this invention is based on the thirtieth aspect thereof, and provides a method wherein the oxide-film forming step comprises depositing the oxide film on the SiC layer.

A thirty-third aspect of this invention is based on the thirtieth aspect thereof, and provides a method further comprising the step of exposing the cleaned 1×1-structure surface of the SiC layer to one of H and $H_2$ before, during, or after the formation of the oxide film, thereby changing the cleaned 1×1-structure surface of the SiC layer into an H-terminated cleaned surface.

A thirty-fourth aspect of this invention is based on the first aspect thereof, and provides a method further comprising the steps of setting the SiC layer as a surface channel layer (5, 48, 102), setting the oxide film as a gate oxide film (7, 49, 105) extending on a surface of the surface channel layer, and forming a gate electrode (8, 50, 106) on the gate oxide film.

A thirty-fifth aspect of this invention is based on the first aspect thereof, and provides a method further comprising the step of forming a field plate on the oxide film.

A thirty-sixth aspect of this invention is based on the first aspect thereof, and provides a method wherein the oxide film includes an interlayer insulating film.

A thirty-seventh aspect of this invention provides a method of fabricating a SiC semiconductor device. The method comprises the steps of preparing a semiconductor substrate (1, 41) made of SiC, the semiconductor substrate being of a first conductivity type and having a main surface and a back surface opposite to each other; forming a drift layer (2, 42) on the main surface of the semiconductor substrate, the drift layer being made of SiC and being of the first conductivity type, the drift layer being higher in resistivity than the semiconductor substrate; forming a base region (3, 43) in a prescribed area in a surface layer portion of the drift layer, the base region having a prescribed depth and being of a second conductivity type different from the first conductivity type; forming a source region (4, 45) in a prescribed area in a surface layer portion of the base region, the source region being shallower than the base region and being of the first conductivity type; forming a surface channel layer (5, 48) connecting the source region and the drift layer, the surface channel layer being made of SiC and being of the first conductivity type; forming a gate oxide film (7, 49) on a surface of the surface channel layer; forming a gate electrode (8, 50) on the gate oxide film; forming a source electrode (10, 52) in contact with the base region and also the source region; and forming a drain electrode (11, 53) on the back surface of the semiconductor substrate; wherein the surface channel layer includes the SiC layer in one of claims, and the gate oxide film includes the oxide film in one of claims.

DETAILED DESCRIPTION OF THE INVENTION

First Embodiment

Figure 1:
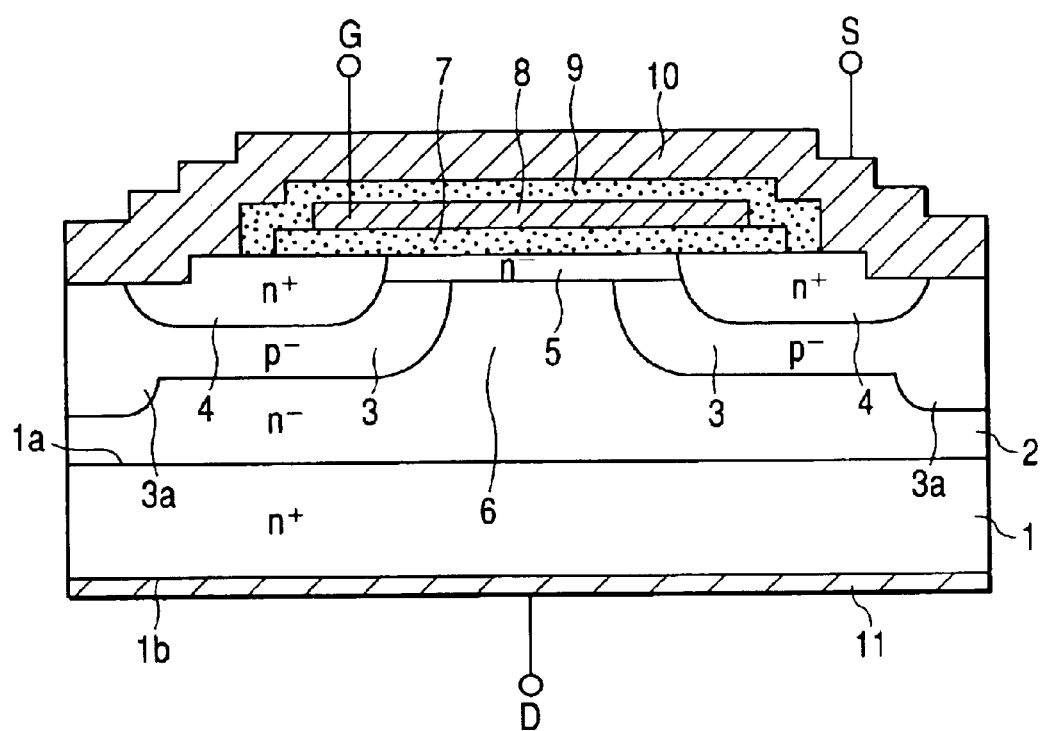
FIG. 1 is a sectional view of a SiC semiconductor device fabricated according to a first embodiment of this invention.

FIG. 1 shows an n-channel planar MOSFET fabricated according to a first embodiment of this invention. The n-channel planar MOSFET is also referred to as an n-channel vertical power MOSFET.

The vertical power MOSFET in FIG. 1 includes an $n^+$ type substrate 1 made of silicon carbide (SiC). The $n^+$ type substrate 1 has an upper surface constituting a main surface 1a, and a lower surface constituting a back surface 1b opposite to the main surface 1a. An n⁻ type drift layer 2 made of SiC is superposed on the main surface 1a of the n⁺ type substrate 1. The n⁻ type drift layer 2 is lower in dopant concentration than the n⁺ type substrate 1. Thus, the n⁻ type drift layer 2 is higher in resistivity than the n⁺ type substrate 1. The main surface 1a of the n⁺ type substrate 1 and an upper surface of the n⁻ type drift layer 2 agree with (0001) planes. Thus, regarding crystals forming the n⁺ type substrate 1 and the n⁻ type drift layer 2, orientation (plane orientation) causing a lower surface state density is selected.

A prescribed area in a surface layer portion of the n⁻ type drift layer 2 is formed with a p type base region 3 having a predetermined depth. The p type base region 3 contains B (boron) as dopant. The p type base region 3 has a dopant concentration of about $1 \times 10^{17}$ cm⁻³ or more. The p type base region 3 includes a deep base region 3a having a greater junction depth. The deep base region 3a enhances an avalanche resistance. A prescribed area in a surface layer portion of the p type base region 3 is formed with an n⁺ type source region 4 shallower than the p type base region 3.

An n⁻ type SiC layer 5 extends on a surface portion of the p type base region 3 in such a manner as to connect the n⁺ type source region 4 and a drift region 6 in the n⁻ type drift layer 2. The n⁻ type SiC layer 5 is formed by epitaxy. A crystal forming an epitaxial film being the n⁻ type SiC layer 5 is of a 4H type, a 6H type, a 3C type, or a 15R type, and a surface of the crystal (the n⁻ type SiC layer 5) is a cleaned Si-terminated SiC surface of a 3×3 structure, a $2 \cdot 3^{1/2} \times 2 \cdot 13^{1/2}$ structure, a $3^{1/2} \times 3^{1/2}$ structure, or a 6×6 structure. Here, "R" denotes radical. In addition, the 3×3 structure, the $2 \cdot 3^{1/2} \times 2 \cdot 13^{1/2}$ structure, the $3^{1/2} \times 3^{1/2}$ structure, and the 6×6 structure mean a 3-fold period structure, a $2 \cdot 3^{1/2} \times 2 \cdot 13^{1/2}$-fold period structure, a $3^{1/2}$-fold period structure, and a 6-fold period structure, respectively. For example, in the case of a 3×3 structure, Si is placed at every 3 periods of the SiC crystal structure. During operation of the vertical power MOSFET, the n⁻ type SiC layer 5 functions as a channel forming layer. The n⁻ type SiC layer 5 is also called the surface channel layer 5.

The surface channel layer 5 contains N (nitrogen) as dopant. The surface channel layer 5 has a low dopant concentration, for example, a dopant concentration in the range of about $1 \times 10^{15}$ cm⁻³ to about $1 \times 10^{17}$ cm⁻³. The dopant concentration in the surface channel layer 5 is equal to or less than those in the n⁻ type drift layer 2 and the p type base region 3. Thereby, it is possible to provide a low on-state resistance of the vertical power MOSFET.

A gate oxide film 7 is formed on an upper surface of the surface channel layer 5 and an inner part of an upper surface of the n⁺ type source region 4. The gate oxide film 7 is made of, for example, $SiO_2$. A gate electrode 8 made of doped polycrystalline silicon is formed on the gate oxide film 7. The gate electrode 8 and an edge portion of the gate oxide film 7 are covered with an insulating film 9 including an LTO (low temperature oxide) film. A source electrode 10 is formed on the insulating film 9. The gate electrode 8 and the source electrode 10 are separated and insulated from each other by the insulating film 9. The source electrode 10 contacts the n⁺ type source region 4 and also the p type base region 3. A drain electrode 11 is formed on the back surface 1b of the n⁺ type substrate 1.

The n-channel planar MOSFET in FIG. 1 operates in a storage mode where a channel is induced without inverting the conductivity type of the surface channel layer 5. Therefore, the n-channel planar MOSFET in FIG. 1 is greater in channel mobility than a MOSFET operating in an inversion mode where the conductivity type is inverted. Thus, the n-channel planar MOSFET in FIG. 1 has a reduced on-state resistance.

In the vertical power MOSFET of FIG. 1, the amount of carbon (carbon atoms) remaining in an interface between the surface channel layer 5 and the gate oxide film 7 is reduced by a procedure mentioned later. Accordingly, it is possible to provide a higher channel mobility and a lower on-state resistance of the vertical power MOSFET of FIG. 1.

A method of fabricating the vertical power MOSFET of FIG. 1 will be described below with reference to FIGS. 2–10.

Figure 2:
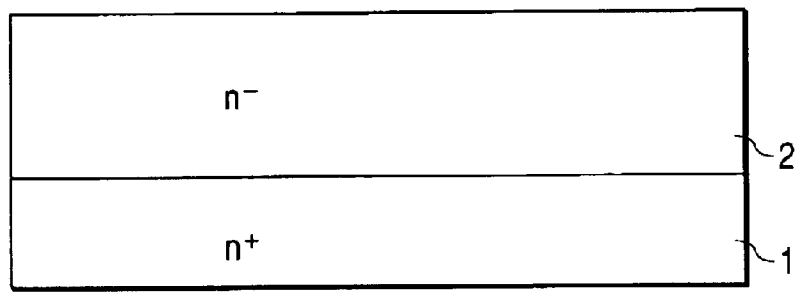
FIGS. 2–10 are sectional views of a semiconductor body in different states which occur during the fabrication of the SiC semiconductor device in FIG. 1.

As shown in FIG. 2, an n⁺ type substrate 1 made of n type 4H—SiC, n type 6H—SiC, n type 3C—SiC, or n type 15R—SiC is prepared. The n⁺ type substrate 1 has a thickness of 400 μm. The n⁺ type substrate 1 has a main surface 1a which agrees with a (0001) plane. An n⁻ type drift layer 2 is formed on the main surface 1a of the n⁺ type substrate 1 by epitaxy. Thus, a crystal forming the n⁻ type drift layer 2 is similar in structure to that forming the base member, that is, the n⁺ type substrate 1. Accordingly, the n⁻ type drift layer 2 is made of 4H—SiC, 6H—SiC, 3C—SiC, or 15R—SiC.

Figure 3:
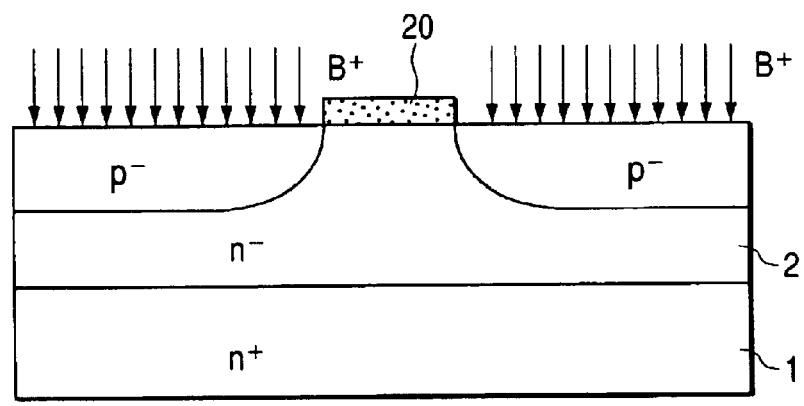

As shown in FIG. 3, an LTO film 20 is placed on a prescribed area in an upper surface of the n⁻ type drift layer 2. While the LTO film 20 is used as a mask, B⁺ ions (boron ions) are implanted into the n⁻ type drift layer 2 via an exposed upper surface thereof to form a p type base region 3. The ion implantation changes a portion of the n⁻ type drift layer 2 into the p type base region 3. The ion implantation is executed at a temperature of 700° C. and a dose of $1 \times 10^{16}$ cm⁻². Aluminum ions may be used instead of boron ions. After the ion implantation, the LTO film 20 is removed from the n⁻ type drift layer 2.

Figure 4:
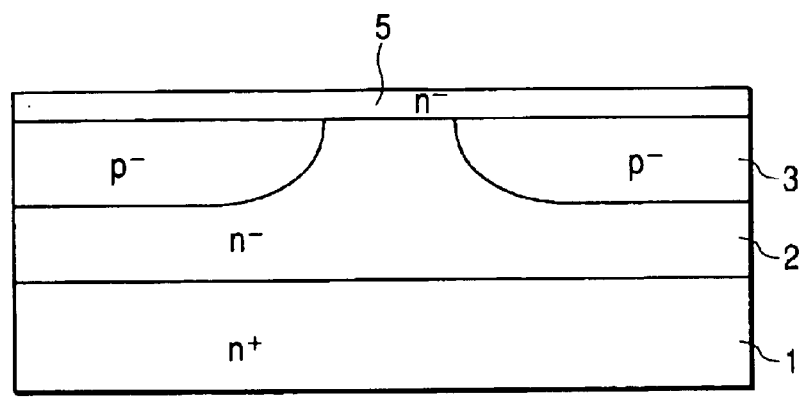

With reference to FIG. 4, after the removal of the LTO film 20, a surface channel layer 5 is epitaxially grown on surface portions of the n⁻ type drift layer 2 and the p type base region 3 by CVD (chemical vapor deposition).

The thickness of the surface channel layer 5 is set so that the vertical power MOSFET will be of the normally-off type. Specifically, conditions required to provide the vertical power MOSFET with normally-off characteristics are that a depletion layer extending in the surface channel layer 5 has a barrier height enough to hinder electric conduction. The thickness of the surface channel layer 5 is chosen so that these conditions will be met. In the event that a gate voltage fails to be applied to the vertical power MOSFET of the normally-off type, a current can not flow therethrough. Accordingly, the vertical power MOSFET of the normally-off type is better in safety than that of the normally-on type.

Figure 5:
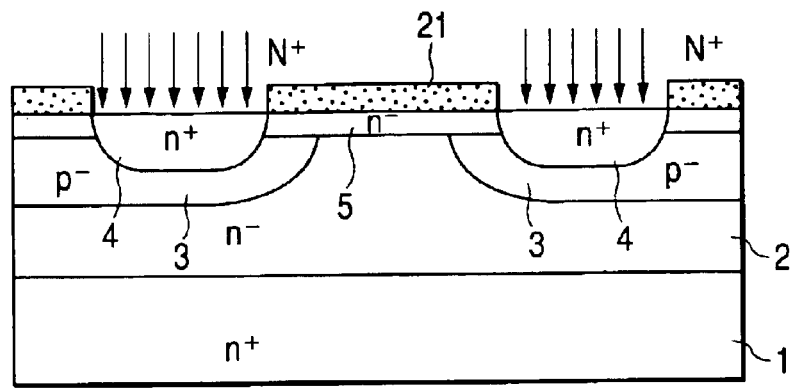

As shown in FIG. 5, an LTO film 21 is placed on a prescribed area in an upper surface of the surface channel layer 5. While the LTO film 21 is used as a mask, N ions (nitrogen ions) are implanted into the surface channel layer 5 and the p type base region 3 via an exposed upper surface of the surface channel layer 5 to form an n⁺ type source region 4. The ion implantation changes portions of the surface channel layer 5 and the p type base region 3 into the n⁺ type source region 4. The ion implantation is executed at a temperature of 700° C. and a dose of $1 \times 10^{15}$ cm⁻². Other ions corresponding to n-type causing impurity may be used instead of nitrogen ions. After the ion implantation, the LTO film 21 is removed from the surface channel layer 5.

Figure 6:
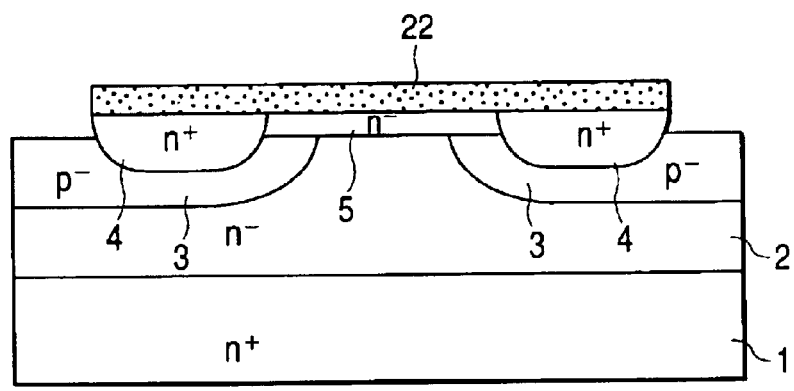

With reference to FIG. 6, after the removal of the LTO film 21, an LTO film 22 is placed on the n⁺ type source region 4 and a prescribed area in the upper surface of the surface channel layer 5 by photoresist processing. While the LTO film 22 is used as a mask, an exposed portion of the surface channel layer 5 which extends outward of the n+ type source region 4 is etched by RIE (reactive ion etching). As a result, the portion of the surface channel layer 5 is removed, and a portion of the p type base region 3 which extends outward of the n+ type source region 4 is exposed.

Figure 7:
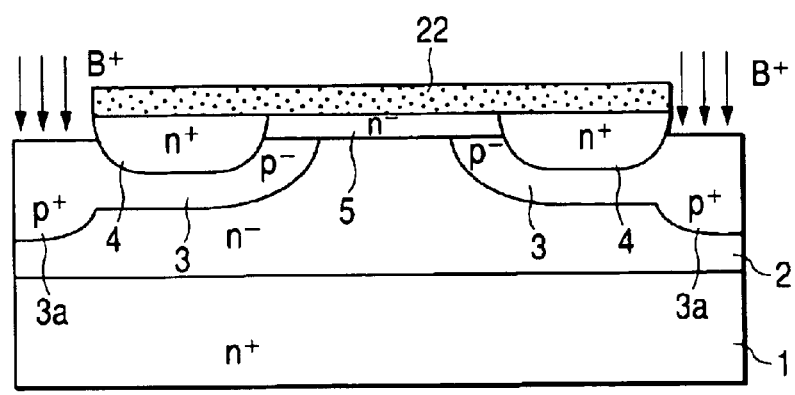

As shown in FIG. 7, while the LTO film 22 is used as a mask, B+ ions (boron ions) are implanted into the p type base region 3 and the n− type drift layer 2 via an exposed upper surface of the p type base region 3 to form a deep base region 3a extending downward from the original p type base region 3. The ion implantation changes a portion of the n− type drift layer 2 into the deep base region 3a. The ion implantation is executed at a temperature of 700° C. and a dose of $1 \times 10^{16}$ cm$^{-2}$. Aluminum ions may be used instead of boron ions. After the ion implantation, the LTO film 22 is removed from the n+ type source region 4 and the surface channel layer 5. The deep base region 3a forms a thick portion of the resultant p type base region 3. The deep base region 3a extends outward of the n+ type source region 4 as viewed from above. Thus, the deep base region 3a and the n+ type source region 4 do not overlap as viewed from above.

Figure 8:
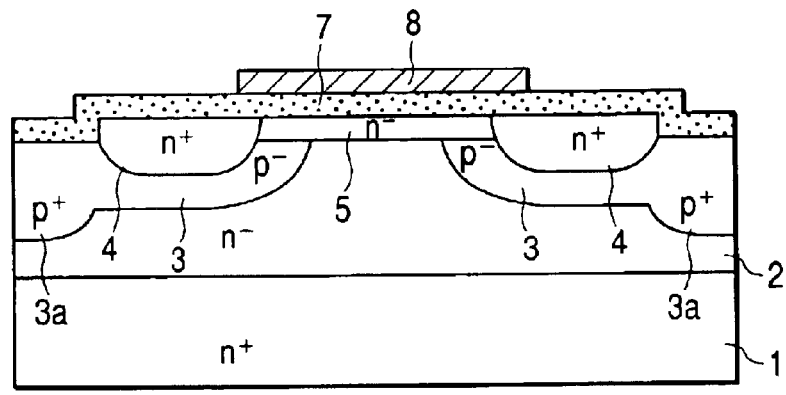

With reference to FIG. 8, after the removal of the LTO film 22, exposed surfaces of the semiconductor body are cleaned. Here, the semiconductor body means a semiconductor wafer having the combination of the n+ type substrate 1 and the layers and regions thereon. The cleaned semiconductor body is placed in an ultra-high vacuum chamber and is heated therein so that an exposed surface of the surface channel layer 5 is processed into an Si-terminated cleaned surface. These steps will further be described with reference to FIGS. 11 and 12.

Figure 11:
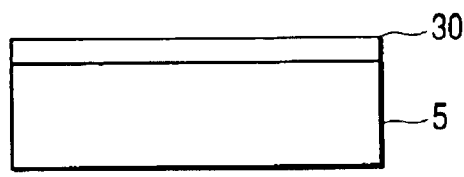
FIGS. 11–14 are sectional views of a portion of the semiconductor body in different states which occur during the fabrication of the SiC semiconductor device in FIG. 1.
Figure 12:
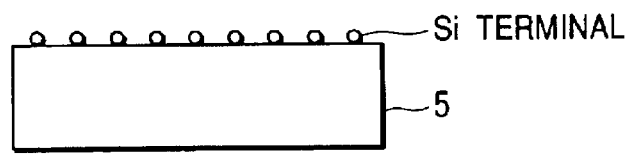

As previously mentioned, the LTO film 22 is removed, and the exposed surfaces of the semiconductor body are cleaned. Thereafter, as shown in FIG. 11, a Si layer 30 is formed on an upper surface of the surface channel layer 5 by, for example, deposition. The Si layer 30 has a thickness of about 5 nm. The ultra-high vacuum chamber which contains the resultant semiconductor body is heated to a temperature in the range of 500° C. to 1100° C. (preferably, 1000° C.), and then continues to be heated at that temperature for a prescribed length of time. Thereby, as shown in FIG. 12, most of atoms composing the Si layer 30 evaporate while only a small number of Si atoms remain on the upper surface of the surface channel layer 5. Specifically, the temperature variation profile of the heating of the ultra-high vacuum chamber is set so that two to three atomic layers of Si remain on the upper surface of the surface channel layer 5, and the resultant upper surface of the surface channel layer 5 becomes an Si-terminated cleaned surface of a 3×3 structure, a $2 \cdot 3^{1/2} \times 2 \cdot 13^{1/2}$ structure, a $3^{1/2} \times 3^{1/2}$ structure, or a 6×6 structure.

Figure 15:
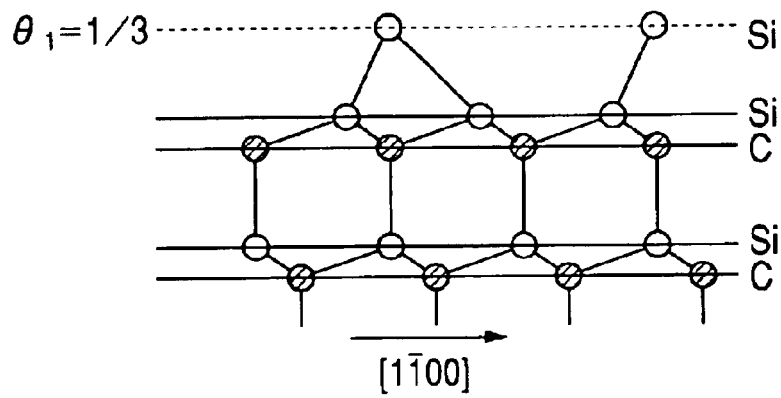
FIG. 15 is a diagrammatic illustration of a first-type $3^{1/2} \times 3^{1/2}$ surface crystal structure as viewed in a lateral direction.
Figure 16:
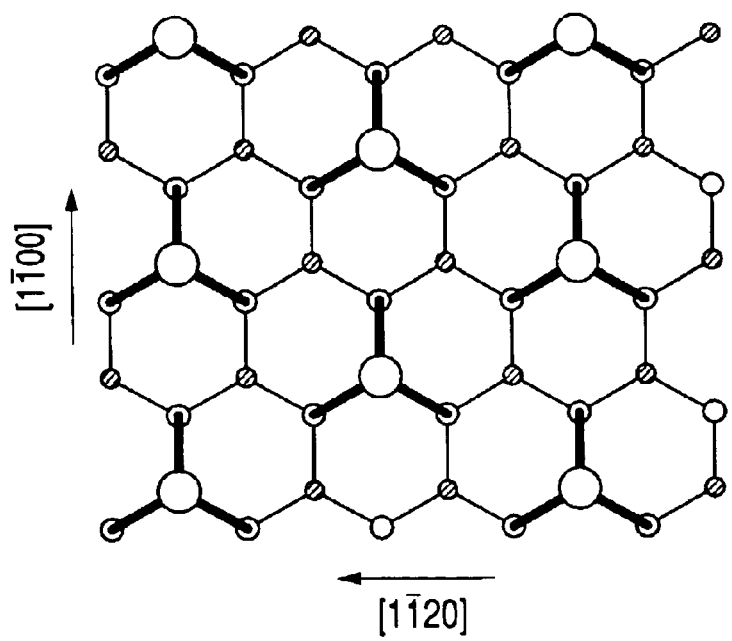
FIG. 16 is a diagrammatic illustration of the first-type $3^{1/2} \times 3^{1/2}$ surface crystal structure as viewed from above.
Figure 17:
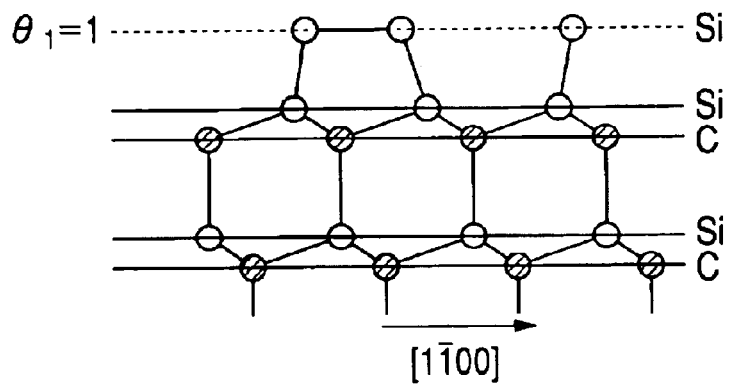
FIG. 17 is a diagrammatic illustration of a second-type $3^{1/2} \times 3^{1/2}$ surface crystal structure as viewed in a lateral direction.
Figure 18:
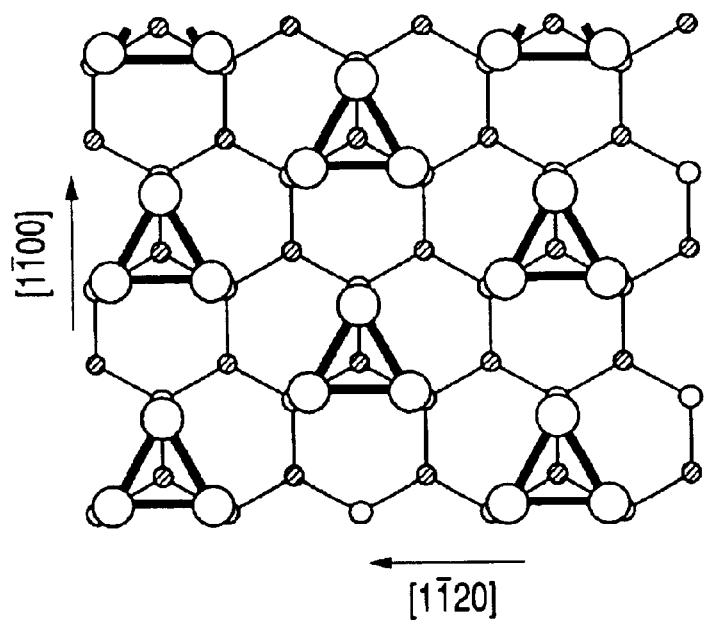
FIG. 18 is a diagrammatic illustration of the second-type $3^{1/2} \times 3^{1/2}$ surface crystal structure as viewed from above.

The Si-terminated surface of the $3^{1/2} \times 3^{1/2}$ structure is of first and second types. FIG. 15 shows the first-type $3^{1/2} \times 3^{1/2}$ surface crystal structure as viewed in a lateral direction. FIG. 16 shows the first-type $3^{1/2} \times 3^{1/2}$ surface crystal structure as viewed from above. As shown in FIGS. 15 and 16, the first-type $3^{1/2} \times 3^{1/2}$ surface crystal structure is such that every terminal Si atom (every topmost Si atom) bonds to three Si atoms which bond to C atoms. FIG. 17 shows the second-type $3^{1/2} \times 3^{1/2}$ surface crystal structure as viewed in a lateral direction. FIG. 18 shows the second-type $3^{1/2} \times 3^{1/2}$ surface crystal structure as viewed from above. As shown in FIGS. 17 and 18, the second-type $3^{1/2} \times 3^{1/2}$ surface crystal structure is such that every terminal Si atom (every topmost Si atom) bonds to a Si atom which bonds to C atoms, and the terminal Si atoms are in groups each of three mutually-bonded members.

Figure 13:
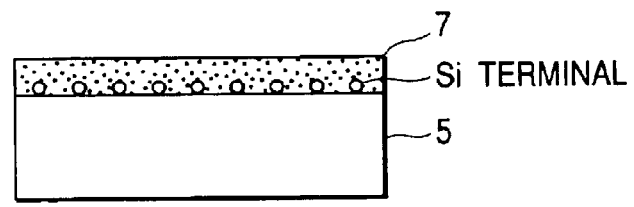

With reference to FIGS. 8 and 13, a gate oxide film 7 is deposited on an exposed upper surface of the semiconductor body which includes the cleaned Si-terminated upper surface of the surface channel layer 5. The gate oxide film 7 includes an LTO film (preferably, an Si-based LTO film). The deposition of the gate oxide film 7 is implemented by LPCVD (low pressure chemical vapor deposition), and the deposition rate is set to 5 nm/min or less. The gate oxide film 7 may be formed by epitaxy.

The semiconductor body having the gate oxide film 7 is subjected to thermal oxidation at a temperature in the rage of 700° C. to 900° C., preferably a temperature of 875° C. During the thermal oxidation, the semiconductor body is in a dry $O_2$ atmosphere (an oxygen gas) so that only terminal Si atoms at the upper surface of the surface channel layer 5 are oxidated. The thermal oxidation may use an ozone gas or a radical gas (an oxygen radical gas) instead of the oxygen gas. The radical gas results from applying ultraviolet rays to oxygen to generate active oxygen.

Figure 14:
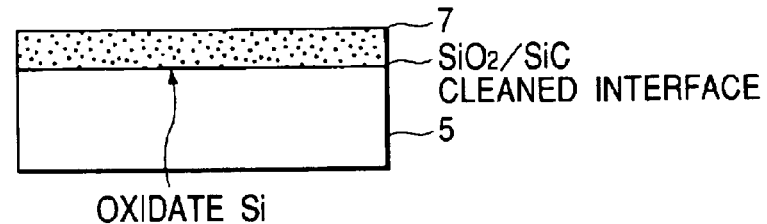

With reference to FIG. 14, as a result of the thermal oxidation, terminal Si atoms at the upper surface of the surface channel layer 5 are oxidated to form $SiO_2$. Thus, the boundary between the gate oxide film 7 and the surface channel layer 5 becomes an $SiO_2$/SiC cleaned interface which hardly contains remaining carbon.

The upper limit of the temperature of the thermal oxidation is set to 900° C. in order to prevent SiC in the surface channel layer 5 from being oxidated.

With reference to FIG. 8, a doped polycrystalline silicon layer is formed on the gate oxide film 7 by LPCVD at a temperature of 600° C. The doped polycrystalline silicon layer is processed into a gate electrode 8 by patterning.

Figure 9:
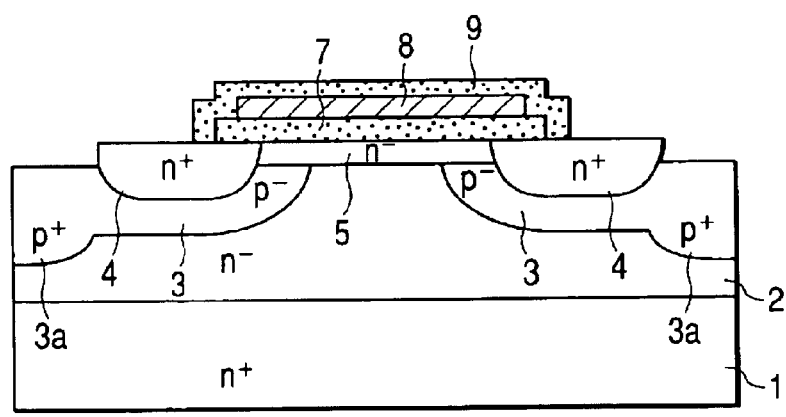

As shown in FIGS. 8 and 9, a portion of the gate oxide film 7 which extends clearly outward of the gate electrode 8 is removed from the semiconductor body. Thereafter, an insulating film 9 made of an LTO is formed on the semiconductor body. The insulating film 9 covers the gate electrode 8 and the gate oxide film 7. The formation of the insulating film 9 is implemented at a temperature of 425° C. After the formation of the insulating film 9, the semiconductor body is annealed at a temperature of 1000° C.

Figure 10:
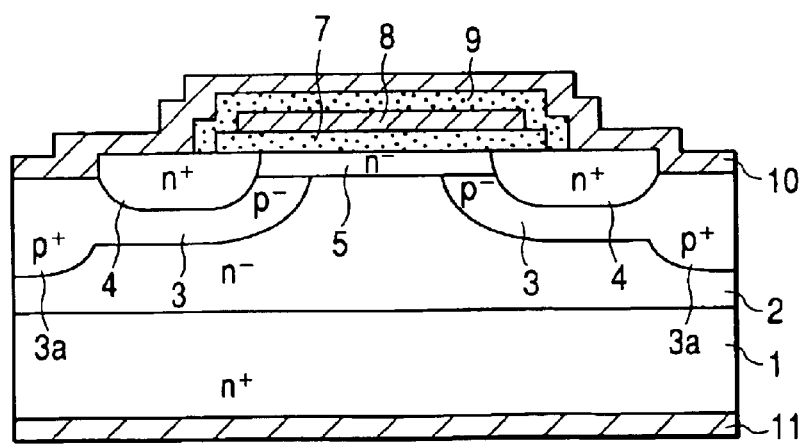

With reference to FIG. 10, after the annealing, metal sputtering is implemented on the semiconductor body to deposit a source electrode 10 and a drain electrode 11 thereon. Thus, the source electrode 10 and the drain electrode 11 are formed on the semiconductor body. The semiconductor body with the source electrode 10 and the drain electrode 11 is annealed at a temperature of 1000° C. As a result, the n-channel planar MOSFET in FIG. 1 is completed.

As previously mentioned, only terminal Si atoms at the upper surface of the surface channel layer 5 are oxidated. Thus, it is possible to prevent the occurrence of oxidation of SiC which would cause remaining carbon in the interface between the gate oxide film 7 and the surface channel layer 5. Accordingly, the amount of remaining carbon in the interface between the gate oxide film 7 and the surface channel layer 5 can be reduced. Therefore, a higher channel mobility and a lower on-state resistance of the n-channel planar MOSFET of FIG. 1 can be provided.

Second Embodiment

A second embodiment of this invention is similar to the first embodiment thereof except for design changes mentioned hereafter.

According to the second embodiment of this invention, after the exposed surface of the surface channel layer 5 is processed into a Si-terminated cleaned surface, a protective film is deposited on the surface of the surface channel layer 5 in an ultra-high vacuum chamber. The protective film includes an SiOx film or a nitride film. The protective film prevents impurity from adhering to the surface of the surface channel layer 5. Thus, a high interface level density caused by impurity is prevented from occurring.

In the case where the protective film includes a nitride film, an ONO film composed of the protective film and an $SiO_2$ film provided on the surface of the surface channel layer 5 can be used instead of the gate oxide film 7.

Third Embodiment

A third embodiment of this invention is similar to the first embodiment thereof except for design changes mentioned hereafter.

The third embodiment of this invention is designed to reduce the amount of carbon remaining in the interface between the gate oxide film 7 and the surface channel layer 5 according to a modified procedure.

Figure 19:
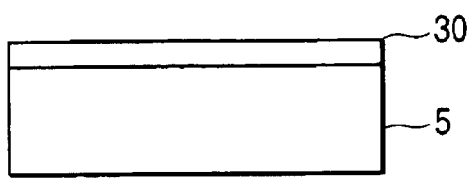
FIGS. 19–22 are sectional views of a portion of a semiconductor body in different states which occur during the fabrication of a SiC semiconductor device according to a third embodiment of this invention.
Figure 20:
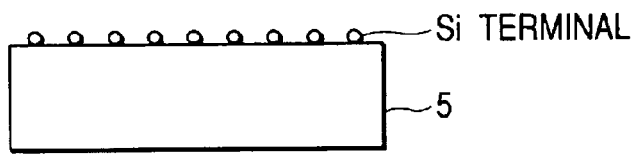

After the removal of the LTO film 22 (see FIGS. 6 and 7), the exposed surfaces of the semiconductor body are cleaned. Thereafter, as shown in FIG. 19, a Si layer 30 is formed on an upper surface of the surface channel layer 5. As in the first embodiment of this invention, the Si layer 30 is processed so that the upper surface of the surface channel layer 5 becomes an Si-terminated cleaned surface of a 3×3 structure, a $2 \cdot 3^{1/2} \times 2 \cdot 13^{1/2}$ structure, a $3^{1/2} \times 3^{1/2}$ structure, or a 6×6 structure (see FIG. 20).

Figure 21:
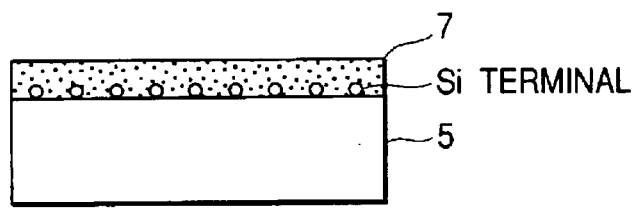

Subsequently, as shown in FIG. 21, a gate oxide film 7 is deposited on the upper surface of the surface channel layer 5. The gate oxide film 7 includes an LTO film. The deposition of the gate oxide film 7 is implemented by LPCVD (low pressure chemical vapor deposition), and the deposition rate is set to 5 nm/min or less.

The semiconductor body having the gate oxide film 7 is subjected to heat treatment at a temperature in the rage of 800° C. to 1000° C., preferably a temperature of 1000° C. During the heat treatment, the semiconductor body is in an inert gas atmosphere (for example, an Ar atmosphere) to prevent the occurrence of oxidation at the upper surface of the surface channel layer 5.

Figure 22:
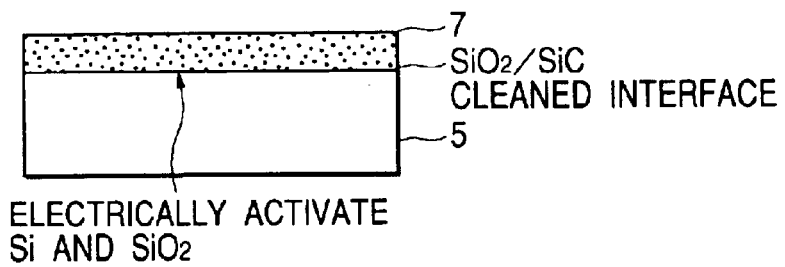

With reference to FIG. 22, as a result of the heat treatment, terminal Si atoms at the upper surface of the surface channel layer 5 bond to $SiO_2$ in the gate oxide film 7 so that electric activity can be available and a MOS function can be provided. The heat treatment temperature is set to cause terminal Si atoms at the upper surface of the surface channel layer 5 to bond to $SiO_2$ in the gate oxide film 7. A gate electrode 8 (see FIG. 8) is formed on the gate oxide film 7.

As previously mentioned, terminal Si atoms at the upper surface of the surface channel layer 5 are caused to bond to $SiO_2$ in the gate oxide film 7 so that they can be electrically active and a MOS function can be provided. It is possible to prevent the occurrence of oxidation of SiC which would cause remaining carbon in the interface between the gate oxide film 7 and the surface channel layer 5. Accordingly, the amount of remaining carbon in the interface between the gate oxide film 7 and the surface channel layer 5 can be reduced.

A protective film including an SiOx film may be formed on the surface of the surface channel layer 5 as in the second embodiment of this invention. In this case, the protective film prevents impurity from adhering to the surface of the surface channel layer 5. Thus, a high interface level density caused by impurity is prevented from occurring.

The formation of the SiOx film may be replaced with the following procedure. After the exposed surface of the surface channel layer 5 is processed into an Si-terminated cleaned surface, $H_2$ molecules or H atoms are applied or fed to the Si-terminated cleaned surface to form an H-terminated cleaned surface. In this case, it is possible to prevent impurity from adhering to the surface of the surface channel layer 5. Furthermore, H-termination removes dangling bonds, and hence an interface level density is reduced.

A sample was made, and experiments were performed on the sample. Specifically, a 3×3 surface structure was made in a vacuum chamber, and an $SiO_2$ film was deposited thereon to complete a sample. Electric characteristics (C-V characteristics) of the sample were measured.

In more detail, while a SiC substrate was in a vacuum chamber (a first chamber) and was heated at a temperature of about 1000° C. in Si flux, a surface of the SiC substrate was provided with a $3^{1/2} \times 3^{1/2}$ structure. Thereafter, the SiC substrate was heated at a temperature of about 900° C. in the Si flux so that a 3×3 surface structure was provided. Thereby, it was possible to prevent silicon droplets from remaining at the SiC surface.

Alternatively, a 3×3 surface structure may be provided in the following procedure. A SiC substrate is heated to a temperature of about 1100° C., and hence a surface of the SiC substrate is provided with a $6 \cdot 3^{1/2} \times 6 \cdot 13^{1/2}$ structure. Thereafter, the SiC substrate is heated at a temperature of about 900° C. so that a 3×3 surface structure is provided.

A protective film being an SiOx film (or a nitride film) was formed on the 3×3 surface structure while the SiC substrate was in the vacuum chamber. Specifically, oxygen gas and Si flux were simultaneously fed to the 3×3 structure in the vacuum chamber, and thereby a silicon oxide film having a thickness of several nanometers was formed thereon.

Subsequently, the sample being the SiC substrate with the protective film was taken out of the vacuum chamber. At this time, the protective film prevented the 3×3 surface structure in the sample from contacting the atmosphere and hence changing in quality. Then, the sample was placed in another chamber (a second chamber). While the sample was in the second chamber, an $SiO_2$ film was deposited on the SiC surface of the sample. Specifically, an $SiO_2$ film having a thickness of about 80 nm was formed on the SiC surface by LPCVD having a deposition rate of 5 nm/min or less. Subsequently, the sample with the $SiO_2$ film was heated at a temperature of 875° C. for 30 minutes to provide an electric junction between the $SiO_2$ film and the SiC substrate. The heating of the sample was executed in an oxygen atmosphere or a nitrogen atmosphere. Both the oxygen atmosphere and the nitrogen atmosphere caused good electric junctions.

According to the third embodiment of this invention, it is possible to provide a high channel mobility, and to further reduce the on-state resistance of the n-channel planar MOSFET.

The $SiO_2$ film may be deposited on the SiC surface of the sample while the sample is in the vacuum chamber (the first chamber). In this case, the $SiO_2$ film may be deposited on the SiC surface of the sample without forming the protective film.

Fourth Embodiment

A fourth embodiment of this invention is similar to the first embodiment thereof except for design changes mentioned hereafter.

The fourth embodiment of this invention is designed to reduce the amount of carbon remaining in the interface between the gate oxide film 7 and the surface channel layer 5 according to a modified procedure.

Figure 23:
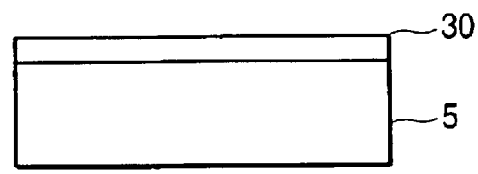
FIGS. 23–25 are sectional views of a portion of a semiconductor body in different states which occur during the fabrication of a SiC semiconductor device according to a fourth embodiment of this invention.
Figure 24:
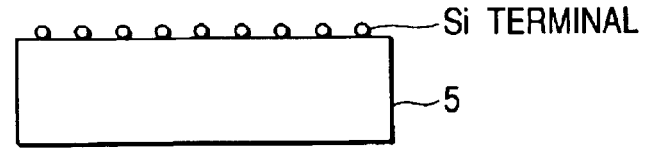

After the removal of the LTO film 22 (see FIGS. 6 and 7), the exposed surfaces of the semiconductor body are cleaned. Thereafter, as shown in FIG. 23, a Si layer 30 is formed on an upper surface of the surface channel layer 5. As in the first embodiment of this invention, the Si layer 30 is processed so that the upper surface of the surface channel layer 5 becomes an Si-terminated cleaned surface of a 3×3 structure, a $2 \cdot 3^{1/2} \times 2 \cdot 13^{1/2}$ structure, a $3^{1/2} \times 3^{1/2}$ structure, or a 6×6 structure (see FIG. 24).

Figure 25:
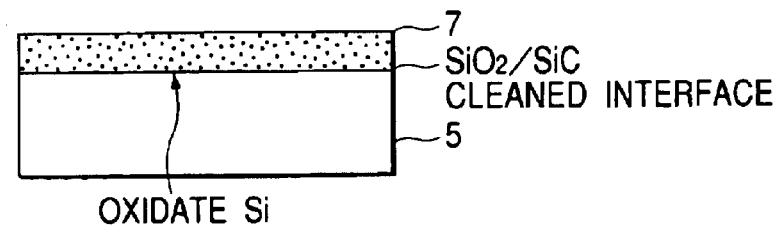

Subsequently, as shown in FIG. 25, Si in an upper portion of the surface channel layer 5 is thermally oxidized to form a gate oxide film 7. The thermal oxidation uses $O_2$, $H_2O$, $O_3$, or oxygen radical. The thermal oxidation is executed at a temperature in the range of 1000° C. to 1400° C. Furthermore, the thermal oxidation is executed while the amount of exposed C at the surface of the surface channel layer 5 is relatively small. Generally, the amount of carbon remaining in the interface increases as exposed C atoms at the surface of the surface channel layer 5 form nuclei. Thus, the small amount of exposed C at the surface of the surface channel layer 5 results in a reduction of the amount of carbon remaining in the interface. The upper limit of the temperature of the thermal oxidation is set to 1400° C. in order to prevent the gate oxide film 7 from changing to cristobalite. A gate electrode 8 (see FIG. 8) is formed on the gate oxide film 7.

As previously mentioned, under the condition where the surface of the surface channel layer 5 is terminated at Si, that is, under the condition where the amount of exposed C at the surface of the surface channel layer 5 is relatively small, the surface of the surface channel layer 5 is formed with the gate oxide film 7 by thermal oxidation. In this case, the amount of carbon remaining in the interface between the gate oxide film 7 and the surface channel layer 5 can be reduced.

A protective film including an SiOx film or a nitride film may be formed on the surface of the surface channel layer 5 as in the second embodiment of this invention. In this case, the protective film prevents impurity from adhering to the surface of the surface channel layer 5. Thus, a high interface level density caused by impurity is prevented from occurring.

The formation of the SiOx film may be replaced with the following procedure. After the exposed surface of the surface channel layer 5 is processed into an Si-terminated cleaned surface, $H_2$ molecules or H atoms are applied or fed to the Si-terminated cleaned surface to form an H-terminated cleaned surface. In this case, it is possible to prevent impurity from adhering to the surface of the surface channel layer 5. Furthermore, H-termination removes dangling bonds, and hence an interface level density is reduced.

Fifth Embodiment

A fifth embodiment of this invention is similar to the first embodiment thereof except for design changes mentioned hereafter.

The fifth embodiment of this invention is designed to reduce the amount of carbon remaining in the interface between the gate oxide film 7 and the surface channel layer 5 according to a modified procedure.

Figure 26:
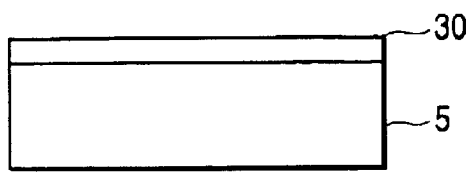
FIGS. 26–29 are sectional views of a portion of a semiconductor body in different states which occur during the fabrication of a SiC semiconductor device according to a fifth embodiment of this invention.
Figure 27:
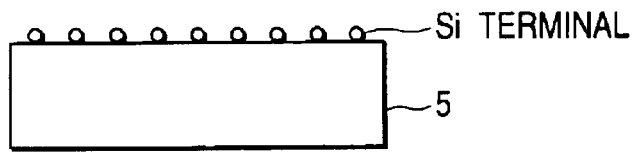

After the removal of the LTO film 22 (see FIGS. 6 and 7), the exposed surfaces of the semiconductor body are cleaned. Thereafter, as shown in FIG. 26, a Si layer 30 is formed on an upper surface of the surface channel layer 5. As in the first embodiment of this invention, the Si layer 30 is processed so that the upper surface of the surface channel layer 5 becomes an Si-terminated cleaned surface of a 3×3 structure, a $2 \cdot 3^{1/2} \times 2 \cdot 13^{1/2}$ structure, a $3^{1/2} \times 3^{1/2}$ structure, or a 6×6 structure (see FIG. 27).

Figure 28:
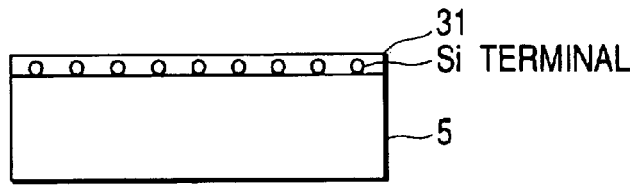
Figure 29:
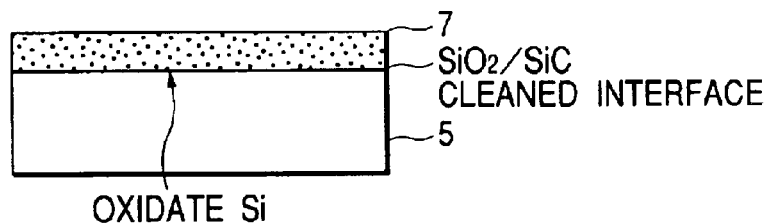

Subsequently, as shown in FIG. 28, a Si layer 31 is epitaxially grown on the upper surface of the surface channel layer 5. Thereafter, as shown in FIG. 29, only the Si layer 31 is thermally oxidized in a dry atmosphere to form a gate oxide film 7. The thermal oxidation is executed at a temperature in the range of 700° C. to 900° C. where SiC in the surface channel layer 5 is prevented from being oxidized. Thus, it is possible to prevent the occurrence of remaining carbon in the interface which would be caused by thermal oxidation of SiC. The upper limit of the temperature of the thermal oxidation is set to 900° C. in order to prevent the oxidation of SiC in the surface channel layer 5. A gate electrode 8 (see FIG. 8) is formed on the gate oxide film 7.

As previously mentioned, the surface of the surface channel layer 5 is terminated at Si. The Si layer 31 is formed on the surface of the surface channel layer 5. Only the Si layer 31 is thermally oxidized to form the gate oxide film 7. Thereby, it is possible to reduce the amount of carbon remaining in the interface between the gate oxide film 7 and the surface channel layer 5.

Sixth Embodiment

A sixth embodiment of this invention is similar to the first embodiment thereof except for design changes mentioned hereafter.

The sixth embodiment of this invention is designed to reduce the amount of carbon remaining in the interface between the gate oxide film 7 and the surface channel layer 5 according to a modified procedure.

Figure 30:
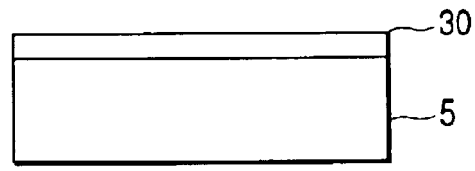
FIGS. 30–33 are sectional views of a portion of a semiconductor body in different states which occur during the fabrication of a SiC semiconductor device according to a sixth embodiment of this invention.
Figure 31:
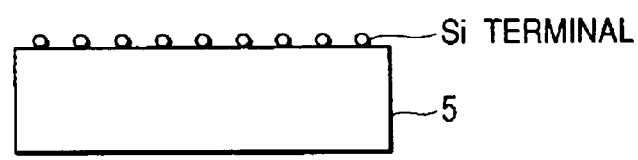

After the removal of the LTO film 22 (see FIGS. 6 and 7), the exposed surfaces of the semiconductor body are cleaned. Thereafter, as shown in FIG. 30, a Si layer 30 is formed on an upper surface of the surface channel layer 5. As in the first embodiment of this invention, the Si layer 30 is processed so that the upper surface of the surface channel layer 5 becomes an Si-terminated cleaned surface of a 3×3 structure, a $2 \cdot 3^{1/2} \times 2 \cdot 13^{1/2}$ structure, a $3^{1/2} \times 3^{1/2}$ structure, or a 6×6 structure (see FIG. 31).

Figure 32:
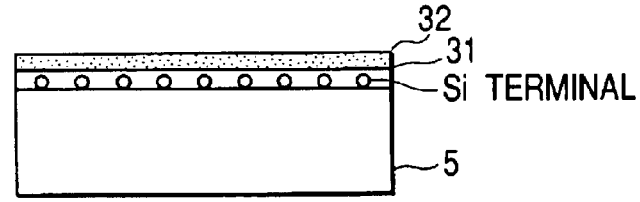
Figure 33:
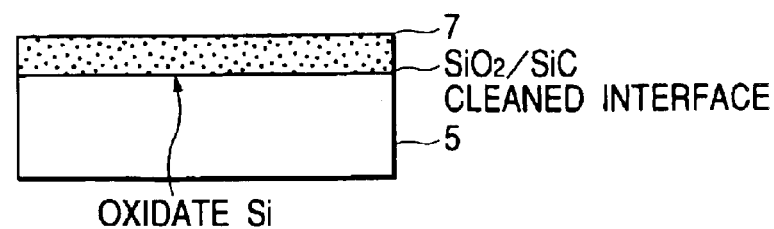

Subsequently, as shown in FIG. 32, a Si layer 31 is epitaxially grown on the upper surface of the surface channel layer 5. Thereafter, an $SiO_2$ film 32 is deposited on an upper surface of the Si layer 31. Then, as shown in FIG. 33, the Si layer 31 is thermally oxidized in a dry atmosphere to form a gate oxide film 7 in conjunction with the $SiO_2$ film 32. The thermal oxidation is executed at a temperature in the range of 700° C. to 900° C. where SiC in the surface channel layer 5 is prevented from being oxidized. Thus, it is possible to prevent the occurrence of remaining carbon in the interface which would be caused by thermal oxidation of SiC. The upper limit of the temperature of the thermal oxidation is set to 900° C. in order to prevent the oxidation of SiC in the surface channel layer 5. A gate electrode 8 (see FIG. 8) is formed on the gate oxide film 7.

As previously mentioned, the surface of the surface channel layer 5 is terminated at Si. The Si layer 31 is formed on the surface of the surface channel layer 5. Only the Si layer 31 is thermally oxidated to form the gate oxide film 7. Thereby, it is possible to reduce the amount of carbon remaining in the interface between the gate oxide film 7 and the surface channel layer 5.

The Si layer 31 may be changed into a SiC layer rather than being thermally oxidized.

Seventh Embodiment

A seventh embodiment of this invention is similar to the first embodiment thereof except for design changes mentioned hereafter.

The seventh embodiment of this invention is designed to reduce the amount of carbon remaining in the interface between the gate oxide film 7 and the surface channel layer 5 according to a modified procedure.

Figure 34:
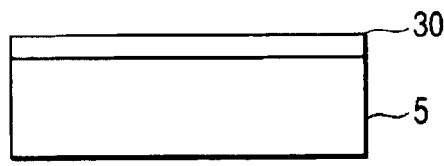
FIGS. 34–37 are sectional views of a portion of a semiconductor body in different states which occur during the fabrication of a SiC semiconductor device according to a seventh embodiment of this invention.
Figure 35:
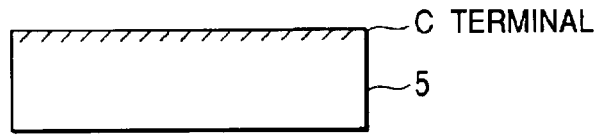

After the removal of the LTO film 22 (see FIGS. 6 and 7), the exposed surfaces of the semiconductor body are cleaned. Thereafter, as shown in FIG. 34, a Si layer 30 is formed on an upper surface of the surface channel layer 5 by, for example, deposition. The Si layer 30 has a thickness of about 5 nm. The ultra-high vacuum chamber which contains the resultant semiconductor body is heated to a temperature in the range of 500° C. to 1100° C. (preferably, 1000° C.), and then continues to be heated at that temperature for a prescribed length of time. Thereby, as shown in FIG. 35, atoms composing the Si layer 30 evaporate. The temperature variation profile of the heating of the ultra-high vacuum chamber is changed from that in the first embodiment of this invention so that the resultant upper surface of the surface channel layer 5 becomes a C-terminated cleaned surface of a 1×1 structure (a 1-fold period structure), a $3^{1/2} \times 3^{1/2}$ structure, or a 6×6 structure.

Figure 36:
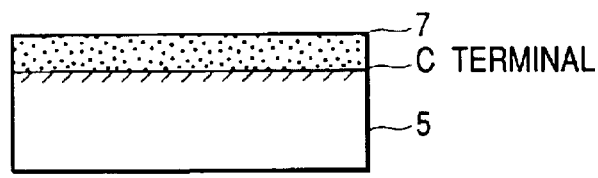

As shown in FIG. 36, a gate oxide film 7 of $SiO_2$ is deposited on the cleaned C-terminated upper surface of the surface channel layer 5. The gate oxide film 7 includes an LTO film. The deposition of the gate oxide film 7 is implemented by LPCVD (low pressure chemical vapor deposition), and the deposition rate is set to 5 nm/min or less. The gate oxide film 7 may be formed by closely depositing TEOS (tetraethylorthosilicate). Alternatively, the gate oxide film 7 may be formed by spin coating.

The semiconductor body having the gate oxide film 7 is subjected to heat treatment at a temperature in the rage of 1200° C. to 1400° C., preferably a temperature of 1250° C. The upper limit of the temperature of the heat treatment is set to 1400° C. in order to prevent the gate oxide film 7 from changing to cristobalite. During the heat treatment, the semiconductor body is in an inert gas atmosphere (for example, an Ar atmosphere) to prevent the occurrence of oxidation at the upper surface of the surface channel layer 5. The pressure of the inert gas atmosphere is set to a vacuum level, $6.65 \times 10^4$ Pa (500 mTorr) or lower, so that CO and $CO_2$ occurring during the heat treatment can be removed.

Figure 37:
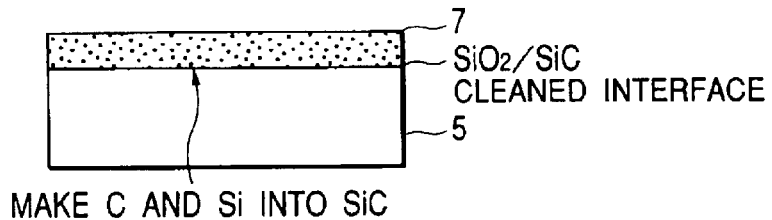

With reference to FIG. 37, as a result of the heat treatment, terminal C atoms at the upper surface of the surface channel layer 5 and $SiO_2$ in the gate oxide film 7 are combined into SiC and gas components. The gas components are removed. Thus, the boundary between the gate oxide film 7 and the surface channel layer 5 becomes an $SiO_2/SiC$ cleaned interface which hardly contains remaining carbon. A gate electrode 8 (see FIG. 8) is formed on the gate oxide film 7.

As previously mentioned, the surface of the surface channel layer 5 is terminated at C. The LTO film (the gate oxide film 7) is deposited on the C-terminated surface of the surface channel layer 5. The semiconductor body with the LTO film is subjected to the high-temperature heat treatment, and hence the boundary between the surface channel layer 5 and the LTO film is processed into the $SiO_2/SiC$ cleaned interface. The LTO film is used as the gate oxide film 7. Accordingly, the interface between the gate oxide film 7 and the surface channel layer 5 hardly contains remaining carbon. Therefore, a higher channel mobility and a lower on-state resistance of the n-channel planar MOSFET can be provided.

A protective film including an SiOx film or a nitride film may be formed on the surface of the surface channel layer 5 as in the second embodiment of this invention. In this case, the protective film prevents impurity from adhering to the surface of the surface channel layer 5. Thus, a high interface level density caused by impurity is prevented from occurring.

Eighth Embodiment

An eighth embodiment of this invention is similar to the first embodiment thereof except for design changes mentioned hereafter.

The eighth embodiment of this invention is designed to reduce the amount of carbon remaining in the interface between the gate oxide film 7 and the surface channel layer 5 according to a modified procedure.

Figure 38:
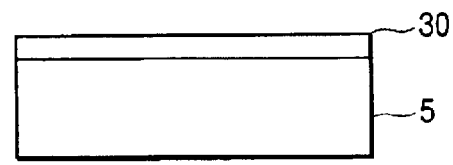
FIGS. 38–41 are sectional views of a portion of a semiconductor body in different states which occur during the fabrication of a SiC semiconductor device according to an eighth embodiment of this invention.
Figure 39:
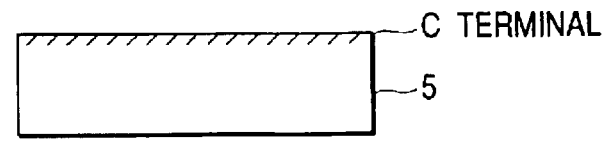

After the removal of the LTO film 22 (see FIGS. 6 and 7), the exposed surfaces of the semiconductor body are cleaned. Thereafter, as shown in FIG. 38, a Si layer 30 is formed on an upper surface of the surface channel layer 5. As in the seventh embodiment of this invention, the Si layer 30 is processed and the heating is executed so that the upper surface of the surface channel layer 5 becomes a C-terminated cleaned surface of a 1×1 structure, a $3^{1/2} \times 3^{1/2}$ structure, or a 6×6 structure (see FIG. 39).

Figure 40:
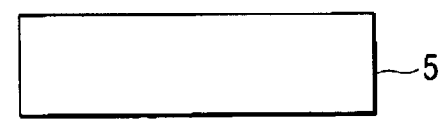

Subsequently, as shown in FIG. 40, the terminal C layer is removed from the surface channel layer 5 by hydrogen treatment, that is, hydrogen-based etching which uses a hydrogen atmosphere. The resultant upper surface of the surface channel layer 5 is clean.

Figure 41:
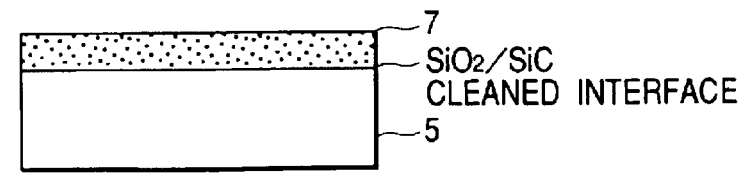

Then, as shown in FIG. 41, a gate oxide film 7 is deposited on the clean upper surface of the surface channel layer 5. The gate oxide film 7 includes an LTO film. The deposition of the gate oxide film 7 is implemented by LPCVD (low pressure chemical vapor deposition), and the deposition rate is set to 5 nm/min or less. A gate electrode 8 (see FIG. 8) is formed on the gate oxide film 7.

As previously mentioned, the terminal C layer is removed from the surface channel layer 5 so that the resultant upper surface of the surface channel layer 5 is clean. The gate oxide film 7 is formed on the clean upper surface of the surface channel layer 5. Accordingly, the boundary between the gate oxide film 7 and the surface channel layer 5 becomes the $SiO_2/SiC$ cleaned interface. Thus, it is possible to provide advantages similar to those given by the first embodiment of this invention.

The gate oxide film 7 may be formed by thermally oxidating a surface portion of the surface channel layer 5.

Ninth Embodiment

A ninth embodiment of this invention is similar to the first embodiment thereof except for design changes mentioned hereafter.

The ninth embodiment of this invention is designed to reduce the amount of carbon remaining in the interface between the gate oxide film 7 and the surface channel layer 5 according to a modified procedure.

Figure 42:
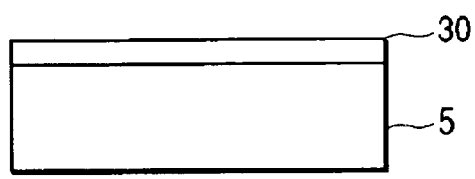
FIGS. 42–44 are sectional views of a portion of a semiconductor body in different states which occur during the fabrication of a SiC semiconductor device according to a ninth embodiment of this invention.
Figure 43:
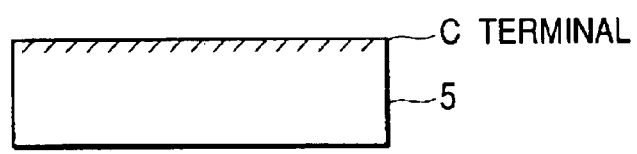

After the removal of the LTO film 22 (see FIGS. 6 and 7), the exposed surfaces of the semiconductor body are cleaned. Thereafter, as shown in FIG. 42, a Si layer 30 is formed on an upper surface of the surface channel layer 5. As in the seventh embodiment of this invention, the Si layer 30 is processed and the heating is executed so that the upper surface of the surface channel layer 5 becomes a C-terminated cleaned surface of a 1×1 structure, a $3^{1/2} \times 3^{1/2}$ structure, or a 6×6 structure (see FIG. 43).

Figure 44:
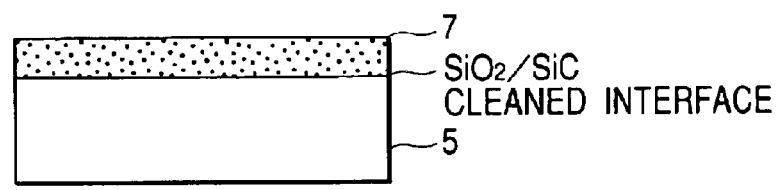

As shown in FIG. 44, a gate oxide film 7 is deposited on the cleaned C-terminated upper surface of the surface channel layer 5. The gate oxide film 7 includes an LTO film. The deposition of the gate oxide film 7 is implemented by LPCVD (low pressure chemical vapor deposition), and the deposition rate is set to 5 nm/min or less.

The semiconductor body with the gate oxide film 7 is subjected to hydrogen treatment and heat treatment to remove dangling bonds from the upper surface of the surface channel layer 5. Specifically, the semiconductor body with the gate oxide film 7 is in a hydrogen atmosphere and is subjected to heat treatment therein so that dangling bonds at the surface of the surface channel layer 5 change into H terminals. As a result of the removal of the dangling bonds, the boundary between the gate oxide film 7 and the surface channel layer 5 becomes an $SiO_2/SiC$ cleaned interface which hardly contains remaining carbon. A gate electrode 8 (see FIG. 8) is formed on the gate oxide film 7.

Before the deposition of the gate oxide film 7 on the upper surface of the surface channel layer 5, the semiconductor body may be subjected to hydrogen treatment and heat treatment to remove dangling bonds from the upper surface of the surface channel layer 5.

As previously mentioned, the dangling bonds are removed from the surface of the surface channel layer 5, and the surface of the surface channel layer 5 is clean. The gate oxide film 7 is formed on the clean surface of the surface channel layer 5. Accordingly, the boundary between the gate oxide film 7 and the surface channel layer 5 becomes the $SiO_2/SiC$ cleaned interface. Thus, it is possible to provide advantages similar to those given by the first embodiment of this invention.

The hydrogen treatment for removing dangling bonds may be implemented during the formation of the gate oxide film 7.

Tenth Embodiment

A tenth embodiment of this invention is similar to the first embodiment thereof except for design changes mentioned hereafter.

The tenth embodiment of this invention is designed to reduce the amount of carbon remaining in the interface between the gate oxide film 7 and the surface channel layer 5 according to a modified procedure.

Figure 45:
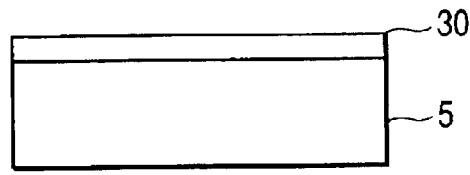
FIGS. 45–49 are sectional views of a portion of a semiconductor body in different states which occur during the fabrication of a SiC semiconductor device according to a tenth embodiment of this invention.
Figure 46:
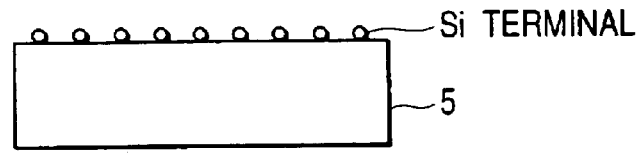

After the removal of the LTO film 22 (see FIGS. 6 and 7), the exposed surfaces of the semiconductor body are cleaned. Thereafter, as shown in FIG. 45, a Si layer 30 is formed on an upper surface of the surface channel layer 5. As in the first embodiment of this invention, the Si layer 30 is processed so that the upper surface of the surface channel layer 5 becomes an Si-terminated cleaned surface of a 3×3 structure, a $2 \cdot 3^{1/2} \times 2 \cdot 13^{1/2}$ structure, a $3^{1/2} \times 3^{1/2}$ structure, or a 6×6 structure (see FIG. 46).

Figure 47:
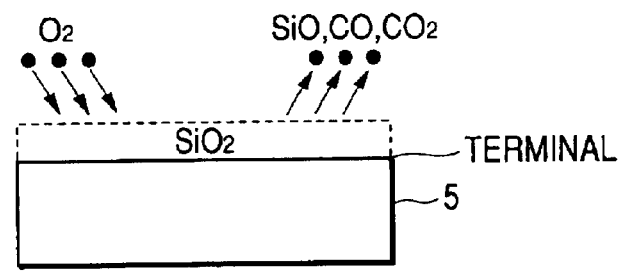
Figure 48:
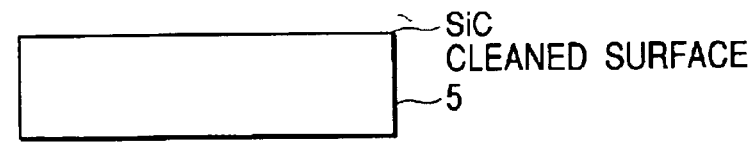

With reference to FIG. 47, while the ultra-high vacuum chamber which contains the resultant semiconductor body remains heated at a temperature in the range of 500° C. to 100° C. (preferably, 1000° C.), oxygen gas is supplied into the ultra-high vacuum chamber as an atmosphere. At this time, the pressure of the atmosphere is set to $1 \times 10^{-2}$ Pa ($1 \times 10^4$ Torr). In addition, the exposure of the upper surface of the surface channel layer 5 to oxygen is set in the range of 10 Pa·s to $10^2$ Pa·s (preferably, 10 Pa·s). Oxygen is adsorbed by the upper surface of the surface channel layer 5. The heating of the semiconductor body at a temperature in the range of 500° C. to 1000° C. prevents a silicon oxide film from being formed on the upper surface of the surface channel layer 5.

During the exposure of the semiconductor body to the oxygen gas, terminal Si at the surface of the surface channel layer 5 and also Si and C in the surface channel layer 5 react with O in the oxygen gas so that they change into SiO, CO, and $CO_2$. SiO, CO, and $CO_2$ are removed from the semiconductor body. Thus, the upper surface of the surface channel layer 5 takes a 1×1 structure where only Si atoms and C atoms composing an SiC crystal are periodically arranged. Accordingly, the upper surface of the surface channel layer 5 becomes a cleaned surface which is not contaminated by C in the atmosphere.

Figure 49:
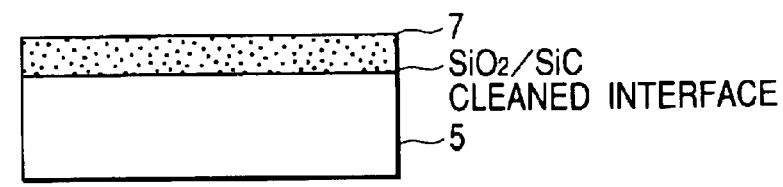

Subsequently, as shown in FIG. 49, a surface portion of the surface channel layer 5 is thermally oxidated at a temperature in the range of 1000° C. to 1400° C. to form a gate oxide film 7. Since the upper surface of the surface channel layer 5 is clean as previously mentioned, the thermal oxidation is implemented while the upper surface of the surface channel layer 5 hardly contains remaining carbon. Generally, the amount of carbon remaining in the interface increases as exposed C atoms at the surface of the surface channel layer 5 form nuclei. Thus, the small amount of exposed C at the surface of the surface channel layer 5 results in a reduction of the amount of carbon remaining in the interface. The upper limit of the temperature of the thermal oxidation is set to 1400° C. in order to prevent the gate oxide film 7 from changing to cristobalite. A gate electrode 8 (see FIG. 8) is formed on the gate oxide film 7.

As previously mentioned, the upper surface of the surface channel layer 5 is terminated at Si. Then, terminal Si at the surface of the surface channel layer 5 and also Si and C in the surface channel layer 5 are made to react with O in the oxygen gas. Thereby, the upper surface of the surface channel layer 5 becomes a cleaned surface. Subsequently, the surface portion of the surface channel layer 5 is thermally oxidated to form the gate oxide film 7. The amount of remaining carbon in the interface between the gate oxide film 7 and the surface channel layer 5 can be reduced. Thus, it is possible to provide advantages similar to those given by the first embodiment of this invention.

Before or during the thermal oxidation, $H_2$ molecules or H atoms are applied or fed to the Si-terminated cleaned surface to form an H-terminated cleaned surface as in the fourth embodiment of this invention. In this case, it is possible to prevent carbon from remaining in the interface between the surface channel layer 5 and the gate oxide film 7. Furthermore, H-termination removes dangling bonds, and hence an interface level density is reduced.

The gate oxide film 7 may be formed by depositing $SiO_2$ on the upper surface of the surface channel layer 5.

Eleventh Embodiment

Figure 50:
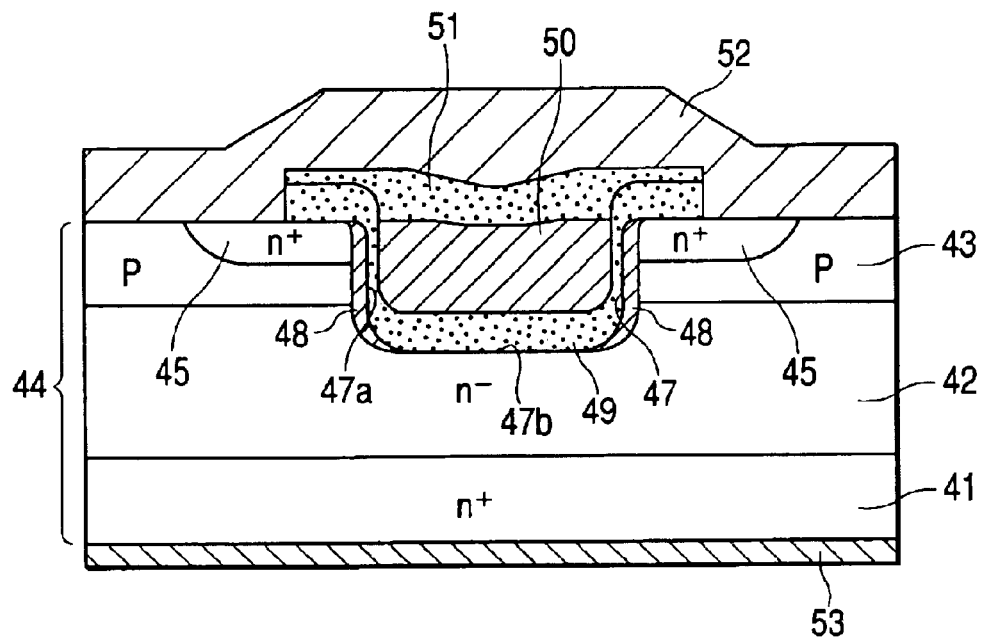
FIG. 50 is a sectional view of a SiC semiconductor device fabricated according to an eleventh embodiment of this invention.

FIG. 50 shows an n-channel trench-gate MOSFET fabricated according to an eleventh embodiment of this invention. The n-channel trench-gate MOSFET is also referred to as an n-channel trench-gate vertical power MOSFET.

The trench-gate MOSFET in FIG. 50 includes a substrate 44 having a laminate of an $n^+$ type semiconductor substrate layer 41, an $n^-$ type epitaxial layer 42, and a p type base layer 43 which are arranged in that order.

A prescribed area in a surface layer portion of the p type base layer 43 is formed with an n+ type source region 45. A trench or groove 47 extends from an upper surface of the substrate 44 into the n− type epitaxial layer 42 through the n+ type source region 45 and the p type base layer 43. A surface 47a defining a side of the trench 47 is formed by a surface channel layer 48 extending in the n− type epitaxial layer 42, the p type base layer 43, and the n+ type source region 45. The surface channel layer 48 is basically made of SiC. A gate oxide film 49 extends on an inner surface of the surface channel layer 48 and a surface of the n− type epitaxial layer 42 which defines a bottom 47b of the trench 47. The gate oxide film 49 is made of, for example, $SiO_2$. A gate electrode 50 extending in the trench 47 is formed on the gate oxide film 49.

An interlayer insulating film 51 is formed on the gate electrode 50 and an edge portion of the gate oxide film 49. A source electrode 52 is formed on the interlayer insulating film 51, an outer portion of the n+ type source region 45, and an outer portion of the p type base region 43. The source electrode 52 is connected with the n+ type source region 45 and the p type base region 43. A drain electrode 53 is provided on a back surface of the substrate 44. The drain electrode 53 is connected with the n+ type semiconductor substrate layer 41.

The trench-gate MOSFET in FIG. 50 is fabricated by a method basically similar to that in one of the first to tenth embodiments of this invention. Specifically, a remaining-C-free interface between the gate oxide film 49 and the surface channel layer 48 is provided as in one of the first to tenth embodiments of this invention.

Twelfth Embodiment

Figure 51:
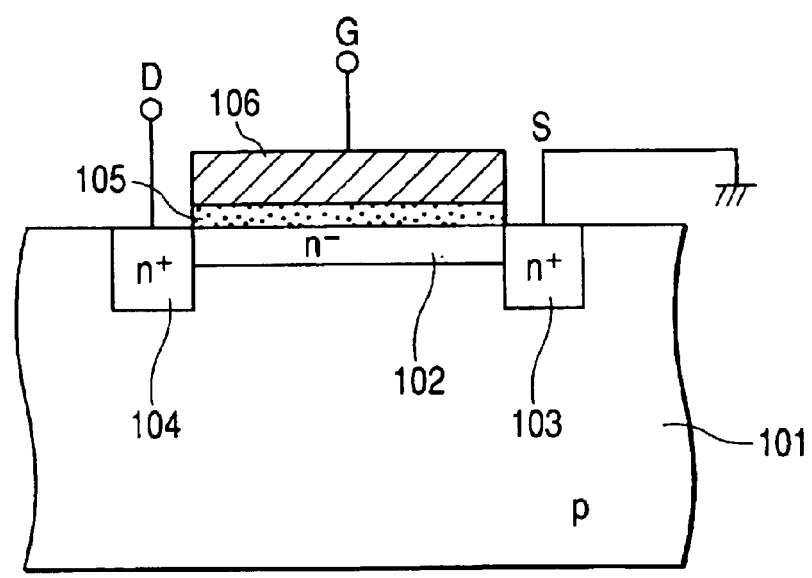
FIG. 51 is a sectional view of a SiC semiconductor device fabricated according to a twelfth embodiment of this invention.

FIG. 51 shows an n-channel lateral MOSFET fabricated according to a twelfth embodiment of this invention.

The lateral MOSFET in FIG. 51 includes a p type semiconductor substrate 101. A prescribed surface area in the substrate 101 is formed with a surface channel layer 102 by ion implantation. The surface channel layer 102 is basically made of SiC. An n+ type source layer 103 and an n+ type drain layer 104 extend in the substrate 101. The n+ type source layer 103 and the n+ type drain layer 104 are located at opposite sides of the surface channel layer 102, respectively. A gate oxide film 105 is superposed on an upper surface of the surface channel layer 102. The gate oxide film 105 is made of, for example, $SiO_2$. A gate electrode 106 is superposed on an upper surface of the gate oxide film 105.

The lateral MOSFET in FIG. 51 is fabricated by a method basically similar to that in one of the first to tenth embodiments of this invention. Specifically, a remaining-C-free interface between the gate oxide film 105 and the surface channel layer 102 is provided as in one of the first to tenth embodiments of this invention.

Thirteenth Embodiment

A thirteenth embodiment of this invention relates to a SiC member (or a SiC region) contacting an insulating film used as an interlayer insulating film. A field plate may be provided on the insulating film. A remaining-C-free interface between the SiC member and the insulating film is provided as in one of the first to tenth embodiments of this invention.

Fourteenth Embodiment

A fourteenth embodiment of this invention is similar to one of the first to tenth embodiments thereof except for design changes mentioned hereafter. According to the fourteenth embodiment of this invention, the thermal oxidation of the surface portion of the surface channel layer 5 or the Si layer 31 to form the gate oxide film uses an oxygen gas, an ozone gas, or a radical gas (as in the third embodiment of this invention).

Fifteenth Embodiment

A fifteenth embodiment of this invention is similar to one of the first to tenth embodiments thereof except for design changes mentioned hereafter. According to the fifteenth embodiment of this invention, the formation of the gate oxide film 7 on the upper surface of the surface channel layer 5 or the formation of the $SiO_2$ film 32 on the upper surface of the Si layer 31 is implemented by LPCVD, TEOS, or spin coating.

Sixteenth Embodiment

A sixteenth embodiment of this invention is similar to one of the first to fifteenth embodiments thereof except for design changes mentioned hereafter. The sixteenth embodiment of this invention provides a method of fabricating a p-channel SiC semiconductor device rather than an n-channel SiC semiconductor device.

Seventeenth Embodiment

A seventeenth embodiment of this invention is similar to one of the first to fifteenth embodiments thereof except for design changes mentioned hereafter. The seventeenth embodiment of this invention provides a method of fabricating a p-channel MOSFET rather than an n-channel MOSFET.

Eighteenth Embodiment

An eighteenth embodiment of this invention is similar to one of the first to seventeenth embodiments thereof except for design changes mentioned hereafter. According to the eighteenth embodiment of this invention, a field plate is formed on the gate oxide film 7, 49, or 105. The gate oxide film 7, 49, or 105 may be an interlayer insulating film.

What is claimed is:

1. A method of fabricating a SiC semiconductor device, comprising the steps of:

processing a surface of a SiC layer into a cleaned surface terminated at Si;

forming an oxide film on the cleaned surface of the SiC layer; and subjecting the SiC layer with the oxide film to thermal oxidation at a temperature in a range of 700° C. to 900° C., thereby oxidating only terminal Si at the cleaned surface of the SiC layer and causing an interface between the oxide film and the SiC layer to be an $SiO_2$/SiC cleaned interface.

2. A method as recited in claim 1, wherein the temperature of the thermal oxidation is equal to 875° C.

3. A method as recited in claim 1, further comprising the step of placing the SiC layer with the oxide film in a dry $O_2$ atmosphere during the thermal oxidation.

4. A method as recited in claim 1, wherein the oxide-film forming step comprises executing LPCVD at a deposition rate of 5 nm/mm or less.

5. A method as recited in claim 1, wherein the surface processing step comprises:

cleaning the surface of the SiC layer;

forming a Si layer on the cleaned surface of the SiC layer;

evaporating most Si of the Si layer and leaving a small number of Si of the Si layer to make the cleaned surface terminated at Si.

6. A method as recited in claim 1, wherein the Si-terminated cleaned surface of the SiC layer has one of a 3×3 structure, a $2 \cdot 3^{1/2} \times 2 \cdot 13^{1/2}$ structure, a $3^{1/2} \times 3^{1/2}$ structure, and a 6×6 structure.

7. A method as recited in claim 1, further comprising the step of forming a protective film of SiOx on the cleaned surface of the SiC layer, wherein the oxide film is formed on the protective film.

8. A method as recited in claim 1, further comprising the step of exposing the Si-terminated cleaned surface of the SiC layer to one of H and $H_2$, thereby changing the Si-terminated cleaned surface of the SiC layer into an H-terminated cleaned surface, wherein the oxide film is formed on the H-terminated cleaned surface of the SiC layer.

9. A method as recited in claim 1, further comprising the steps of setting the SiC layer as a surface channel layer, setting the oxide film as a gate oxide film extending on a surface of the surface channel layer, and forming a gate electrode on the gate oxide film.

10. A method as recited in claim 1, further comprising the step of forming a field plate on the oxide film.

11. A method as recited in claim 1, wherein the oxide film includes an interlayer insulating film.

12. A method of fabricating a SiC semiconductor device, comprising the steps of:
 processing a surface of a SiC layer into a cleaned surface terminated at Si;
 forming an oxide film on the cleaned surface of the SiC layer; and
 subjecting the SiC layer with the oxide film to heat treatment at a temperature in a range of 800° C. to 1000° C., thereby enabling terminal Si at the cleaned surface of the SiC layer and SiO2 in the oxide film to be electrically active and causing an interface between the oxide film and the SiC layer to be an SiO2/SiC cleaned interface.

13. A method as recited in claim 12, wherein the temperature of the heat treatment is equal to 1000° C.

14. A method as recited in claim 12, further comprising the step of placing the SiC layer with the oxide film in an inert gas atmosphere during the heat treatment.

15. A method of fabricating a SiC semiconductor device, comprising the steps of:
 processing a surface of a SiC layer into a cleaned surface terminated at Si;
 forming a Si layer on the cleaned surface of the SiC layer; and
 subjecting the SiC layer with the Si layer to thermal oxidation at a temperature in a range of 700° C. to 900° C., thereby oxidating only Si in the Si layer and terminal Si at the cleaned surface of the SiC layer to form an oxide film on the resultant SiC layer, and causing an interface between the oxide film and the resultant SiC layer to be an $SiO_2$/SiC cleaned interface.

16. A method as recited in claim 15, further comprising the step depositing an $SiO_2$ layer on the Si layer before the thermal oxidation is executed, wherein the $SiO_2$ layer forms a portion of the oxide film.

* * * * *

UNITED STATES PATENT AND TRADEMARK OFFICE
CERTIFICATE OF CORRECTION

PATENT NO. : 6,841,436 B2 Page 1 of 1
APPLICATION NO. : 10/267867
DATED : January 11, 2005
INVENTOR(S) : Yoshiyuki Hisada, Eiichi Okuno and Takeshi Hasegawa It is certified that error appears in the above-identified patent and that said Letters Patent is hereby corrected as shown below:

Title page,

Correct the title in Item (54) to read : METHOD OF FABRICATING SiC SEMICONDUCTOR DEVICE Signed and Sealed this Fourth Day of July, 2006

JON W. DUDAS
*Director of the United States Patent and Trademark Office*